United States Patent
Hoshino et al.

(10) Patent No.: US 7,619,424 B2
(45) Date of Patent: Nov. 17, 2009

(54) PROBE NEEDLE, METHOD FOR MANUFACTURING THE PROBE NEEDLE AND METHOD FOR CONSTRUCTING A THREE-DIMENSIONAL STRUCTURE

(75) Inventors: Tomohisa Hoshino, Amagasaki (JP); Hiroyuki Hashimoto, Nishinomiya (JP); Muneo Harada, Nishinomiya (JP)

(73) Assignee: Tokyo Electron Limited (JP)

( * ) Notice: Subject to any disclaimer, the term of this patent is extended or adjusted under 35 U.S.C. 154(b) by 134 days.

(21) Appl. No.: 11/661,349

(22) PCT Filed: Aug. 29, 2005

(86) PCT No.: PCT/JP2005/015637

§ 371 (c)(1), (2), (4) Date: Feb. 28, 2007

(87) PCT Pub. No.: WO2006/025309

PCT Pub. Date: Mar. 9, 2006

(65) Prior Publication Data

US 2007/0259506 A1    Nov. 8, 2007

(30) Foreign Application Priority Data

Aug. 30, 2004  (JP) .............................. 2004-251081

(51) Int. Cl.
*G01R 31/02* (2006.01)
*G01R 31/28* (2006.01)

(52) U.S. Cl. ...................................... 324/754

(58) Field of Classification Search ............... 324/158.1, 324/750–765; 438/53, 482; 156/629, 643, 156/647
See application file for complete search history.

(56) References Cited

U.S. PATENT DOCUMENTS

| | | | |
|---|---|---|---|
| 6,255,126 B1 | 7/2001 | Mathieu et al. | |
| 6,400,166 B2 * | 6/2002 | Babson et al. | 324/754 |
| 7,005,751 B2 * | 2/2006 | Khandros et al. | 257/780 |
| 7,271,602 B2 * | 9/2007 | Tunaboylu et al. | 324/754 |
| 2002/0000821 A1 | 1/2002 | Haga et al. | |
| 2003/0113990 A1 | 6/2003 | Grube et al. | |
| 2003/0210063 A1 | 11/2003 | Haga et al. | |
| 2004/0121627 A1 | 6/2004 | Grube et al. | |
| 2007/0290698 A1 * | 12/2007 | Mochizuki et al. | 324/754 |

FOREIGN PATENT DOCUMENTS

| | | |
|---|---|---|
| JP | 09-167667 | 6/1997 |
| JP | 2001-343397 | 12/2001 |
| JP | 2003-121468 | 4/2003 |

* cited by examiner

*Primary Examiner*—Jermele M Hollington
*Assistant Examiner*—Trung Q Nguyen
(74) *Attorney, Agent, or Firm*—Finnegan, Henderson, Farabow, Garrett & Dunner L.L.P.

(57) ABSTRACT

A method for manufacturing a probe needle having beams and a contactor placed on tips of the beams comprises preparing a Si wafer 20, forming a seed layer 21 on the Si wafer 20, and forming grooves in a desired shape of the beams on the seed layer 21 by patterning a photoresist 23. Subsequently, the grooves are filled up with metal-plated layers 24a, 24b to form the desired shape of beams.

6 Claims, 7 Drawing Sheets

PROBE NEEDLE, METHOD FOR MANUFACTURING THE PROBE NEEDLE AND METHOD FOR CONSTRUCTING A THREE-DIMENSIONAL STRUCTURE

TECHNICAL FIELD

This invention relates to probe needles, a method for manufacturing the same and a method for constructing a three-dimensional structure, and more particularly, to a complex shape of probe needle, a method for manufacturing the same and a method for constructing a three-dimensional structure.

BACKGROUND ART

Conventional probe needles are described in U.S. Pat. No. 6,255,126 and U.S. application No. 2003/0113990, for example.

U.S. Pat. No. 6,255,126 discloses a spring contactable probe needle formed by successively depositing a plurality of layers.

In addition, U.S. application No. 2000/0113990 discloses a probe needle with a cantilevered-beam supported by a plurality of legs and a method for manufacturing the same.

Conventional probe needles are thus manufactured and structured as disclosed in the above publications. According to U.S. Pat. No. 6,255,126, the probe needle is fixed at its base part and is formed by successively depositing a plurality of layers so that the probe needle zigzags but extends generally straight upwardly. When a contactor formed on the tip of this probe needle makes contact with an object to be tested, the beam part may bend and hit the adjoining beams, causing breakage of the beams. Similarly, U.S. application No. 2003/0113990 discloses the same basic configuration. Therefore, it is impossible to densely arrange the probe needles and to form the desired shape of probe needles. Even if it is possible, the manufacturing method of such probe needle could be complicated.

DISCLOSURE OF THE INVENTION

The present invention is made in view of the problems and has an object to provide a probe needle that can be densely arranged and have any desired shape, a method for readily manufacturing the probe needle and a method for constructing a three-dimensional structure.

A probe needle according to the present invention includes a plurality of serpentine beams fixed at one of their ends and a connecting section placed at the other ends of the plurality of serpentine beams and for connecting with the plurality of serpentine beams. The connecting section is provided with a contactor on its one side that is opposite to the side to which the beams are connected.

Preferably, the plurality of serpentine beams are a pair of beams that are folded at a predetermined frequency, and the folding frequencies of the pair of the serpentine beams are the same.

More preferably, the pair of serpentine beams are mutually out of phase.

More preferably, the mutual folding phase shift between the pair of serpentine beams is 180 degrees.

One end of the probe needle is preferably connected to an interposer.

In another aspect of the present invention, a method for manufacturing a probe needle having long beams and a contactor placed at tips of the beams includes a step of preparing a substrate, a step of forming a film having grooves in the shape of the beams on the substrate, a step of forming metal layers inside the grooves, and a step of removing the substrate and film to take out the metal layers.

Preferably, the grooves in the shape of the beams are in a serpentine pattern.

More preferably, the serpentine pattern includes a first serpentine pattern and a second serpentine pattern located away from the first serpentine pattern.

It is preferable that the first and second serpentine patterns have folded curves at a predetermined frequency.

A positioning groove for each of the first and second serpentine grooves may be formed concurrently with the formation of the first and second serpentine grooves.

Preferably, the method for manufacturing the probe needle further comprises a step of separating the film having the first serpentine groove and the film having the second serpentine groove from the substrate having the first and second serpentine grooves, a step of aligning the separated films having the first serpentine groove and the separated films having the second serpentine groove with respect to the positioning grooves, and a step of bonding the aligned films with a bonding material.

The bonding material used herein is preferably an interlayer insulation film. In addition, the interlayer insulation film is made of an organic resin material.

More preferably, the method for manufacturing the probe needle further comprises a step of fixing the base portions of the beams. The step of fixing the base portions of the beams includes a step of preparing a beam retaining member having fixing sections to which the base portions of the beams are fixed. The beam retaining member has a plurality of fixing sections each having a connection hole that is wider on the front side and becomes inwardly narrower. The step of fixing the base portions of the beams includes a step of removing a part of the films bonded with the bonding material from the base portion side of the beams to expose the base portions, made of the metal layers, of the beams as anchor piles, and a step of inserting the exposed anchor piles into the connection holes.

The beam retaining member is preferably an interposer.

Preferably, the method for manufacturing the probe needle further comprises a step of connecting the beams made of the metal layers in the first and second serpentine patterns and the contactor.

In another aspect of the present invention, a method for constructing a three-dimensional structure comprises a first step of preparing a substrate, a second step of forming a film having grooves in a desired complex shape on the substrate, a third step of forming metal layers inside the grooves, and a step of removing the substrate and film to take out the metal layers, thereby constructing the desired complex three-dimensional structure with the metal layers.

Preferably, the method for constructing the three-dimensional structure further comprises a step of preparing a plurality of substrates having grooves with the metal layers formed therein by repeating the first to third steps, a step of aligning the prepared plurality of substrates having the grooves with the metal layers formed therein, and a step of removing the aligned plurality of substrates and films to take out the metal layers.

More preferably, the step of aligning the prepared plurality of substrates having the grooves with the metal layers formed therein further includes a fourth step of forming positioning holes for positioning, a step for preparing a plurality of substrates having the positioning holes and grooves with the metal layers formed therein by repeating the first to fourth steps, and a step of aligning the prepared plurality of substrate having the grooves with the metal layers formed therein with respect to the positioning holes.

The probe needle according to the present invention includes a plurality of serpentine beams each having one fixed end and the other end connected to the connecting section that is provided with the contactor. The two serpentine beams supporting a contactor bend with a certain bending strength along the only direction in which the curved portions of the serpentine beams exist.

By limiting the bending direction of the beams, the probe needle can be arranged densely.

In addition, the probe needle according to the present invention can obtain a desired bending strength by adjusting the folding frequency of the serpentine beams.

In another aspect of the present invention, a method for manufacturing a probe needle having long beams and a contactor placed at tips of the beams includes a step of preparing a substrate, a step of forming a film having grooves in the shape of the beams on the substrate, a step of forming metal layers inside the grooves, and a step of removing the substrate and film to take out the metal layers.

The beam sections of the probe needle can be formed by forming grooves on a plane substrate, and therefore any complex shaped beam can be readily formed.

As a result, a method for readily manufacturing any shape of probe needles can be provided.

DETAILED DESCRIPTION OF THE INVENTION

Figure 1:
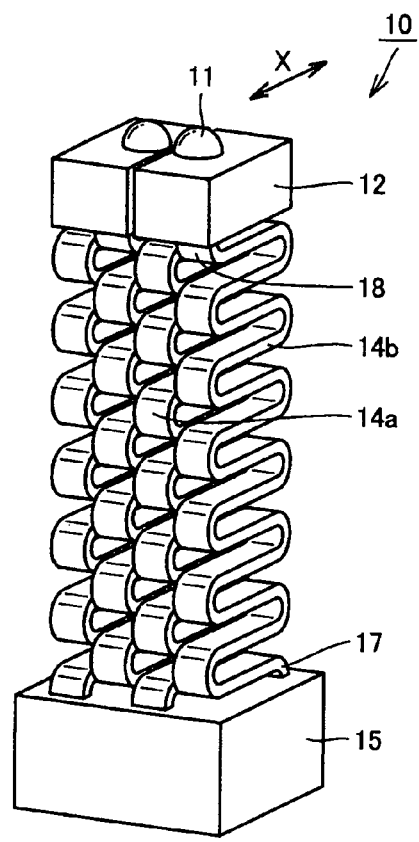
FIG. 1 is a perspective view of probe needles according to one embodiment of the invention.

By referring to drawings, description will be made regarding one embodiment of the invention below. FIG. 1 is a perspective view of probe needles according to one embodiment of the invention. With reference to FIG. 1, a probe needle 10 includes two serpentine beams 14a, 14b fixed at one of their ends (base portions) on a block 15, a connecting section 12 connecting the other ends of the two serpentine beams 14a, 14b, and a contactor 11 placed on the connecting section 12 to contact an object to be tested.

In FIG. 1, two probe needles 10 are mounted on the block 15.

In this embodiment, each of the two serpentine beams 14a, 14b are folded at a predetermined frequency (interval) so that the curved parts of the beams 14a, 14b are 180 degrees out of phase with each other in the height direction, in other words, the convex curves of the beam 14a align with the concave curves of the beam 14b, and accordingly the beam 14a pairs up with the beam 14b.

Because the probe needle 10 is thus cantilevered with the pair of serpentine beams 14, which are 180 degrees out of phase with each other, from the block 15, the probe needle 10 bends only in the direction along the curved parts of the beams 14 (i.e. direction indicated by X of FIG. 1). Consequently, this configuration limits the bending direction of the probe needle, therefore enabling a dense arrangement of the plurality of probe needles 10.

Alternatively, the pair of serpentine beams 14a, 14b can have the curved parts being in phase with each other. Such beams 14a, 14b can make the probe needle 10 more bendable in a certain direction. By adjusting the phase shift of the pair of serpentine beams 14a, 14b, adjustment of the bending strength of the beam can be made.

This serpentine beam is not limited to such a shape including the curved parts and linear parts as shown in FIG. 1, but may be corrugated or zigzagged.

In addition, description is made regarding the two probe needles 10 mounted on one block 15 with reference to FIG. 1, the present invention is not limited to this. The block 15 can receive one probe needle, three probe needles, or more. This block 15 may be anything as long as the probe needle 10 can be fixed on; however, preferably is an interposer as will be described later.

Next, description will be made regarding a method for manufacturing the probe needle 10. FIGS. 2 through 7 illustrate the respective steps of the manufacturing method of the probe needle 10 according to one embodiment of the invention.

Figure 2A:
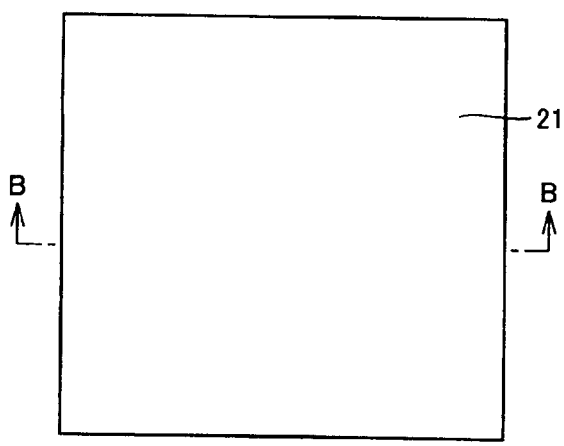
FIG. 2A is a plan view of a substrate in the course of a manufacturing method of beams of the probe needle.
Figure 2B:
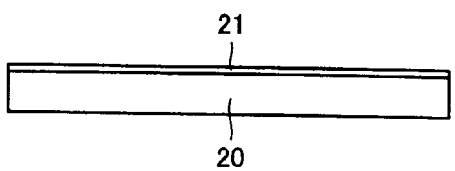
FIG. 2B is a cross-sectional view taken along line B-B of FIG. 2A.

FIG. 2A is a plan view, and FIG. 2B is a cross-sectional view taken along line B-B of FIG. 2A (FIGS. 3 and 4 below are shown in an analogous fashion). Referring to FIG. 2, a Si wafer 20 is first prepared as a substrate, and a seed layer (e.g. Au layer) 21 is formed on a surface of the Si wafer 20.

Figure 3A:
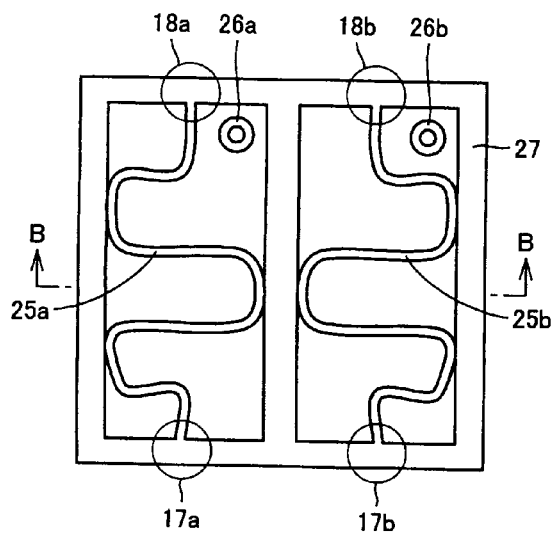
FIG. 3A is a plan view of a wafer in the course of the manufacturing method of the beams of the probe needle.
Figure 3B:
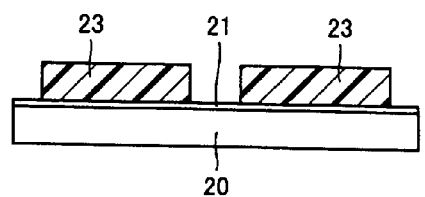
FIG. 3B is a cross-sectional view taken along line B-B of FIG. 3A.

Next, as shown in FIG. 3, the desired shape of grooves, which will be beams of a probe needle, are formed on the seed layer 21 with the use of a photoresist 23 for example. In FIG. 3, resist pattern is formed on one piece of Si (SiO$_2$ or SiN) wafer 20 so as to expose a pair of serpentine grooves 25a, 25b, which are symmetrically curved with respect to a center line (hereinafter referred to as "out of phase"), four mating sides 27 and a center line 28 surrounding the pair of serpentine grooves 25a, 25b, and mating holes (grooves) 26.

The mating sides 27 and mating holes 26 are used for positioning as will be described later.

Because the part to be the beams of the probe needle 10 can be thus formed on the Si wafer 20 in a two-dimensional manner, any shape of the beam can be formed.

At the time of forming the beams, the positions of base portions 17a, 17b, which are fixed on the block 15, and the positions of free ends 18a, 18b, which are connected to the connecting section 12, of the pair of serpentine grooves 25a, 25b can be accurately determined by photolithography.

Figure 4A:
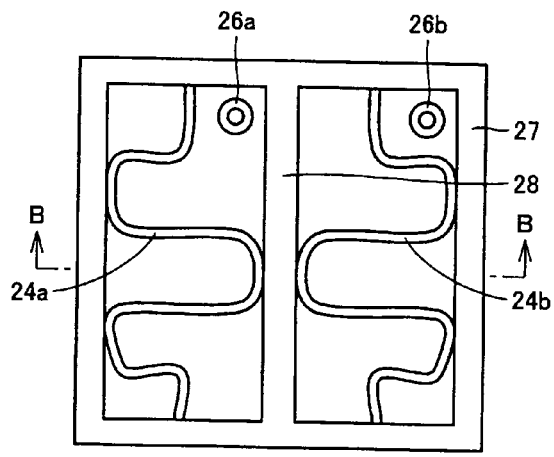
FIG. 4A is a plan view of the wafer in the course of the manufacturing method of the beams of the probe needle.
Figure 4B:
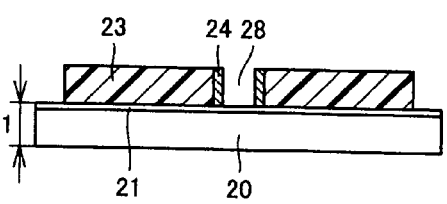
FIG. 4B is a cross-sectional view taken along line B-B of FIG. 4A.

Next, as shown in FIGS. 4A and 4B, serpentine-shaped plated layers (e.g. Au layers) 24a, 24b are formed on the pair of serpentine grooves 25a, 25b, respectively.

Figure 4C:
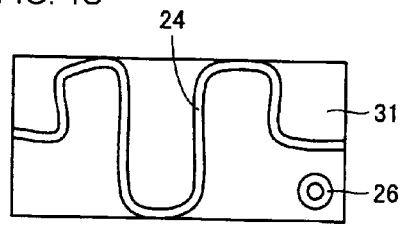
FIG. 4C is a plan view of a photoresist layer.

Subsequently, the exposed parts of the seed layer 21, that is, the four mating sides 27 and center line 28 surrounding the pair of serpentine plated layers 24a, 24b are melted, for example, to be removed together with the substrate on which the seed layer is formed. Then, as shown in FIG. 4C, photoresist layers 31 each having a serpentine plated layer 24 and mating hole 26 are taken out. FIG. 4C shows only the left part of FIG. 4A.

FIGS. 5A-5C show a method for making up a plurality of probe needle pairs with the photoresist layers 31, which are taken out in FIG. 4C and have the mutually out-of-phase plated layer 24a or 24b.

FIG. 5A illustrates the photoresist layers 31, each of which having the mutually out-of-phase serpentine plated layer 24a or 24b, successively aligned in contact with each other; FIG. 5B illustrates a plurality of connecting sections 12, each of which having a contactor 11 thereon, connected to the free ends 18 of the serpentine plated layers 24a, 24b formed in the photoresist layers 31; and FIG. 5C illustrates a connection face of a silicon interposer 40 having a plurality of fixing sections 41 at which the base portions 17 of the serpentine plated layers are fixed. The connecting sections 12 in FIG. 5C are represented as if they have no thickness, however they actually have a predetermined thickness as shown in FIG. 1.

Figure 5:
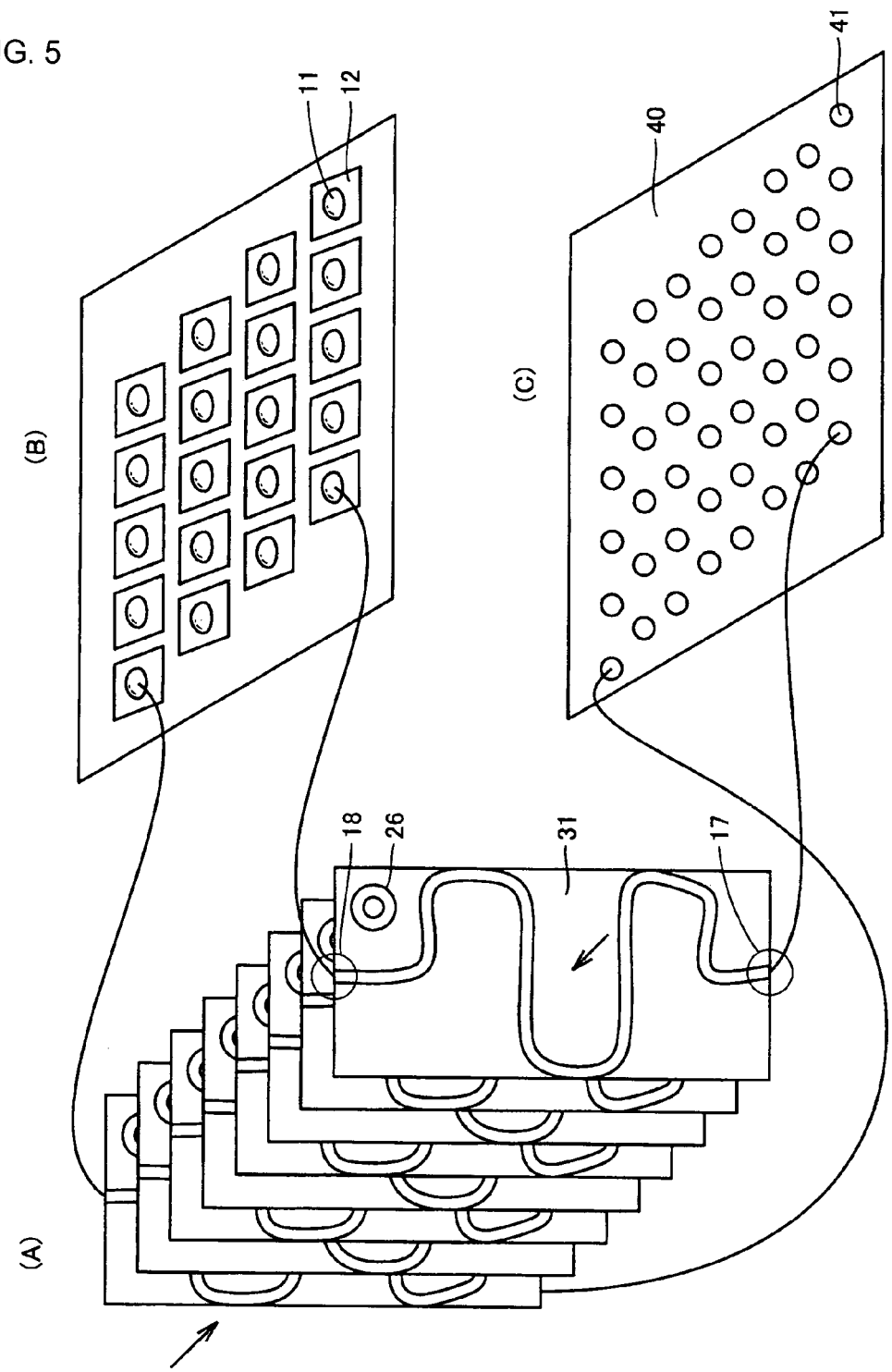
FIGS. 5A-5C illustrate a method for making up a plurality of probe beams.
Figure 7:
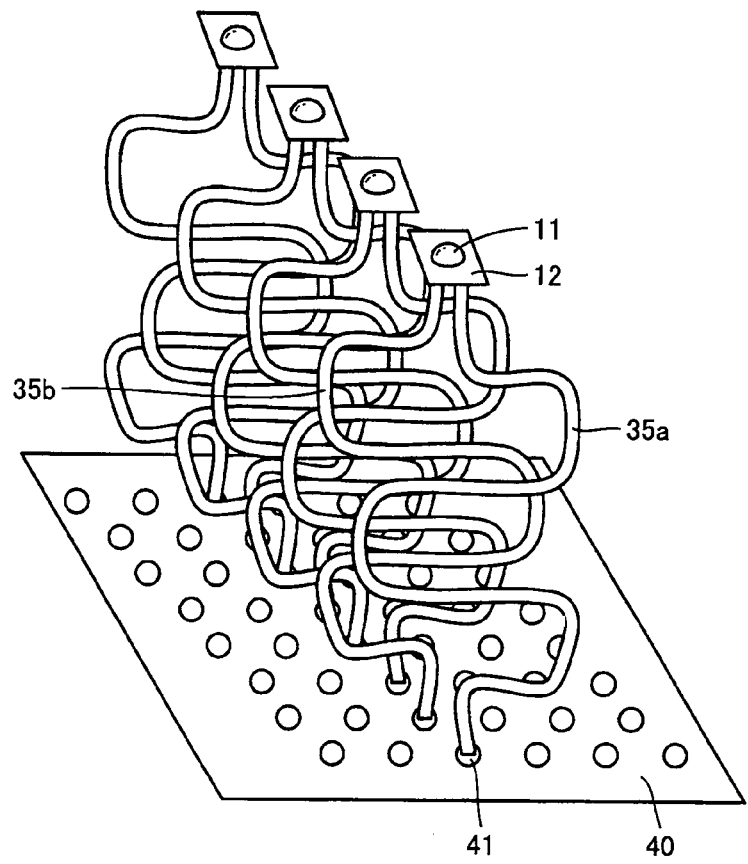
FIG. 7 illustrates steps of the manufacturing method of the beam of the probe needle.

It should be appreciated that the photoresist layers 31 having the serpentine plated layers 24a, 24b and also the serpentine plated layers 24a, 24b have a predetermined depth, however, FIGS. 5 and 7 just illustrate the photoresist layers 31 in solid lines and the plated layers 24a, 24b in thick lines for the sake of clarity.

Figure 6:
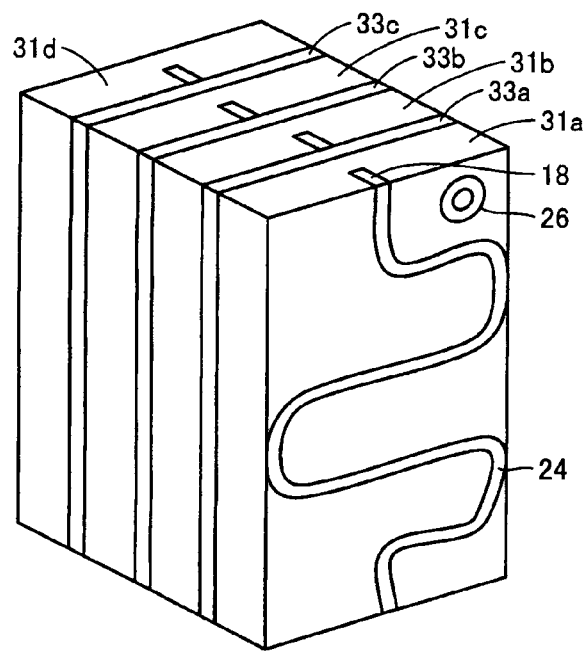
FIG. 6 specifically illustrates the beams of FIG. 5 in a bonded state.

The separated photoresist layers 31 as shown in FIG. 4C are positioned with respect to the mating holes 26 as shown in FIG. 5A. The positioned state of the photoresist layers 31 are shown in FIG. 6. In FIG. 6, four photoresist layers 31a to 31d are positioned.

In addition, the plurality of photoresist layers 31 can be positioned with respect to the above-mentioned precisely formed mating sides 27 instead of the mating holes 26.

Referring to FIG. 6, the photoresist layers 31a to 31d are temporarily bonded with a bonding material 33 placed therebetween. The bonding material 33 used herein is preferably an interlayer insulation film. The interlayer insulation film can be made of an organic resin material such as electrodeposited polyimide. The reason why the organic resin material such as electrodeposited polyimide is used is that the materials' resilient property facilitates positioning as will be described later.

A connecting section 12 is mounted on every pair of free ends 18 of the thus bonded photoresist layers 31. The connecting section 12 is made of Au for example, and forms a metal junction for connection with the serpentine-shaped plated layer 24 which is also made of Au.

At this point, if the plurality of connecting sections 12 are initially formed as one piece as shown in FIG. 5B and then placed on the free ends 18 of the plurality of photoresist layers 31, easier connection between the connecting sections 12 and the free ends 18 of the photoresist layers 31 can be achieved.

As shown in FIG. 5C, the base portions 17 of the photoresist layers 31 are connected to the fixing sections 41 of the silicon interposer 40 in the same manner. The fixing sections 41 used herein are also made of Au for example, and form a metal junction with the respective base portions 17 of the photoresist layer 31.

After the free ends 18 and base portions 17 of the photoresist layers 31 are connected with the connecting sections 12 and fixing sections 41 of the silicon interposer 40, respectively, as shown in FIGS. 5 and 6, the Si wafer 20 and photoresist layer 31 are melted to be removed as illustrated in FIG. 7.

As shown in FIG. 7, with the removal of the photoresist 23, a plurality of probe needles 10 can be obtained each having a pair of Au serpentine beams 35a, 35b, which are mutually out of phase with each other, and in which the base portions 17 are connected to the fixing sections 41 of the silicon interposer 40 and the free ends 18 are connected to the connecting section 12.

It should be understood that the photoresist 23 is used in this embodiment and therefore melted to be removed; however a resin resist and metal resist are also available and the removal thereof may be chosen depending on the resist material in use. For example, ashing technique with oxidation can be also effective instead of the melting technique.

Figure 8:
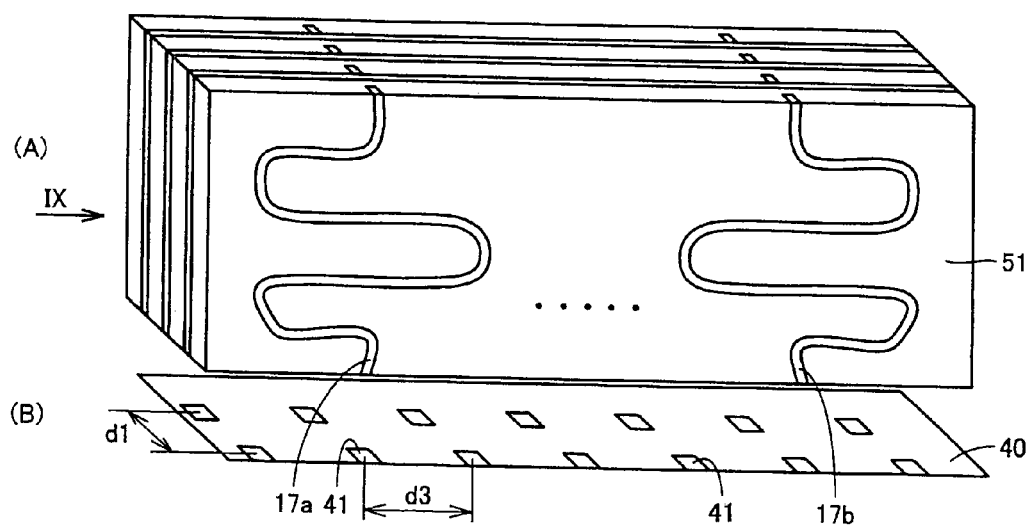
FIGS. 8A-8B illustrate the plurality of beams of the probe needle bonded together.

Another embodiment of the present invention will be described now. FIG. 8 illustrates another embodiment of the invention. The description with reference to FIGS. 5 to 7 is for the case where there is no special problem in alignment of the serpentine beams 35 and the fixing sections 41 provided on the silicon interposer 40.

However, the positions of the serpentine beams 35 and fixing sections 41 do not always match well. In view of this problem, next description will be made regarding the case of misalignment of the serpentine beams 35 and fixing sections 41 in this embodiment.

FIG. 8A corresponds to FIG. 4C in the last embodiment, while FIG. 8B illustrates a plurality of photoresist layers bonded together shown in FIG. 8A viewed from the bottom.

FIG. 8A shows the photoresist layers 51 each including two serpentine plated layers formed therein. Thus, the plurality of photoresist layers 51 each having the plurality of beams can be bonded as shown in FIG. 6.

Referring to FIG. 8A, the photoresist layer 51 in this embodiment changes according to the thickness of the photoresist 23 at the time of formation. For example, as shown in FIG. 8B, the pitch between the bonded photoresist layers is d1. In this case, the base portions 17 of the serpentine beams 35 are formed at pitch d1, but the pitch d1 may generally vary by plus or minus 5 μm depending of the dimension of the photoresist 23 at the time of formation.

On the other hand, the fixing sections 41, which are connected with the base portions 17, on a surface of the silicon interposer 40 are formed at a constant interval (e.g. d2). Because photolithography is used to form the pair of serpentine beams 35 on the photoresist layer 51, the dimension d3 between base portions 17a and 17b can be positioned with considerably high precision.

As apparent from FIGS. 8A and 8B, the dimension d1 between the base portions in the thickness direction of the photoresist layer 51 does not always match with the corresponding interval between the fixing sections 41 on the silicon interposer 40.

Figure 9:
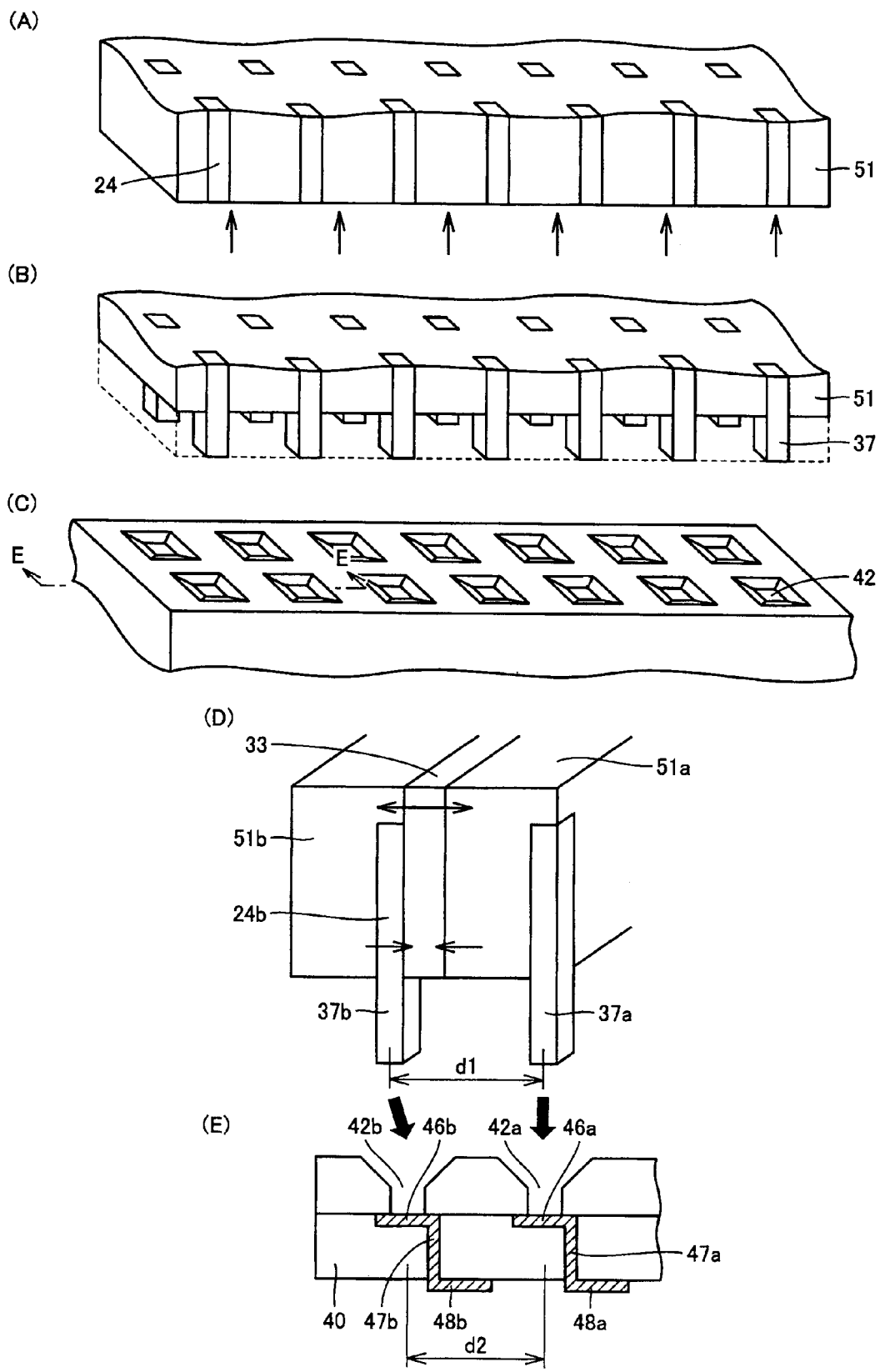
FIGS. 9A-9E illustrate a method of attaching the probe needles to an interposer in another embodiment.

FIGS. 9A to 9E show the process subjected to the photoresist layer 51 and silicon interposer 40 in order to deal the mismatch. FIG. 9A illustrates the photoresist layer 51 in FIG. 8A with the beams around their base portions. FIG. 9B illustrates the photoresist layer 51 with anchor piles 37 made of the plated layer 24 by etching a given quantity of the photoresist layer 51 in the state shown in FIG. 9A from the base portion side of the beams. FIG. 9C illustrates the silicon interposer 40 with pyramid windows 42, serving as the fixing sections 41, formed on its surface.

FIG. 9D is a view on arrow IX in FIG. 8A. The lower part of FIG. 9D illustrates the anchor piles 37 exposed by removing the photoresist 23 as shown in FIG. 9B. FIG. 9E is a cross-sectional view taken along line E-E of FIG. 9C. On the front surface of the silicon interposer 40, wiring layers 46 are formed which are connected to wiring layers 48 on the rear surface of the silicon interposer 40 via through holes 47.

The illustrations of FIGS. 9A to 9E are made with reference to the case of FIG. 8 as an example, however the process can be applied to the case of FIG. 6 in an analogous manner.

Note that the drawings in FIGS. 8A, 8B and FIGS. 9A to 9E, illustrating the serpentine beams 35 in the direction including the curved surface are represented in an enlarged manner, and the number of the serpentine beams 35 does not coincide with the number of the fixing sections 41 formed on a front face of the silicon interposer 40.

Next, description will be made regarding a method for connecting the anchor piles 37 formed at the base portions 17 of the serpentine beams 35 and the fixing section 41 on the silicon interposer 40. The photoresist layer 51 in the state of FIG. 9A is etched to partially remove the photoresist 23 enclosed by the dotted line and to expose the base portions 17 of the plated layer 24 as shown in FIG. 9B, thereby forming the anchor piles 37.

On the other hand, pyramid windows 42 are formed with insulating films at the fixing sections 41 so as to have wider openings at the front surface of the silicon interposer 40 and to be inwardly narrower. As shown in FIGS. 9D and 9E, even if the pitch d1 between the anchor piles 37a and 37b is different from the pitch d2 between the pyramid windows 42a and 42b, the anchor piles 37a, 37b can be inserted into the pyramid windows 42a, 42b as shown by heavy arrows in FIG. 9E because the bonding material 33 such as electrodeposited polyimide having resilient property is stretchable in the direction indicated by arrows as shown in FIG. 9D, thereby enabling secure connection of the serpentine beams 35 and the fixing sections 41 on the silicon interposer 40.

Although each of the pyramid windows 42a, 42b in this embodiment has a rectangle opening on the front surface of the silicon interposer 40 and four sides inwardly inclined from the opening, the pyramid windows 42a, 42b are not limited to the above shape and can have two opposite tapered sides or one tapered side. In addition, when the anchor piles 37 are cylindrical, conical windows are also available.

Figure 10:
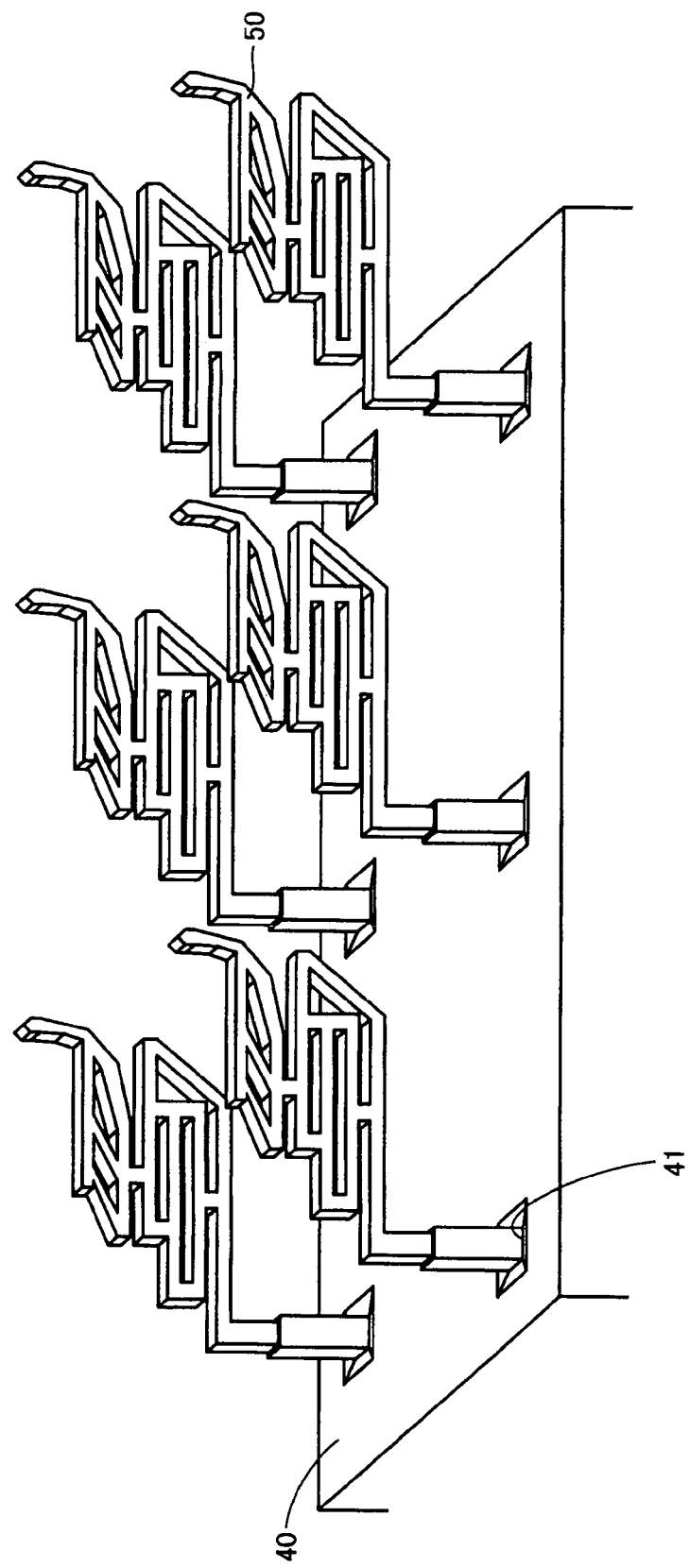
FIG. 10 illustrates another example of the probe needle shape according to the invention.

Yet another embodiment of the present invention will be now described. FIG. 10 illustrates yet another embodiment of the invention. Referring to FIG. 10, complex shaped beams 50 used in probe needles are formed at the fixing sections 41 on the silicon interposer 40 in this embodiment. Since photolithography is used to form the beams of the probe needles with a resist in this embodiment, any complicated shape of beam 50 in use for the probe needle can be formed as shown in FIG. 10.

The description in this embodiment is about the formation of any complex shape of beams in use for the probe needle, however, the present invention is applicable to the method for constructing any complex three-dimensional structure as shown in FIG. 10 by the method described in FIGS. 2 to 9.

The "complex shape" in this embodiment includes at least shapes that cannot be expressed by a single line.

In the above mentioned embodiments, photoresist and photolithography are used to form the desired shape of beams, the present invention is not limited to this, and any film can be utilized to form the beams as long as the film allows the grooves, which will be the beams of the probe needle, to be formed thereon.

Although the probe needles are connected to the silicon interposer in the above-mentioned embodiment, the present invention is not limited to this and applicable to interposers made of any kind of material.

Although the metal layers to be the beams of the probe needles are plated in the above mentioned embodiment, the present invention is not limited to this, and the metal layers can be formed by any method.

Although the plated layers are made of Au in the above mentioned embodiment, the present invention is not limited to this, and any kind of metal is available for the plated layers.

Although Au is used for the connecting section with the contactor and the connecting section with the interposer in the above mentioned embodiment, the present invention is not limited to this, and any kind of metal is available for the connecting sections.

Although the free ends and fixed ends of the plated layers form metal junctions for connecting with the connecting sections in the above mentioned embodiment, an appropriate connection method can be adopted according to the material to be connected.

The foregoing has described the embodiments of the present invention by referring to the drawings. However the invention should not be limited to the illustrated embodiments. It should be appreciated that various modifications and changes can be made to the illustrated embodiments within the scope of the appended claims and their equivalents.

INDUSTRIAL APPLICABILITY

The probe needle according to the present invention including beam sections formed in plane can take on any complex shape and therefore can be advantageously utilized.

What is claimed is:

1. A probe needle comprising:
   a plurality of serpentine beams fixed at one of their ends; and
   a connecting section placed at the other ends of said plurality of serpentine beams and for connecting said plurality of serpentine beams, wherein
   said connecting section is provided with a contactor on one side thereof, said side being opposite to the side to which said beams are connected, and the contactor making contact with an object to be tested,
   said plurality of serpentine beams are a pair of beams folded at a predetermined frequency,
   the folding frequencies of said pair of serpentine beams are the same, and
   said folding frequencies of said pair of serpentine beams are mutually out of phase.

2. The probe needle according to claim 1, wherein the mutual folding phase shift between said pair of serpentine beams is 180 degrees.

3. The probe needle according to claim 1, wherein one end of said probe needle is connected to an interposer.

4. A probe needle comprising:
   a plurality of serpentine beams fixed at one of their ends; and
   a connecting section placed at the other ends of said plurality of serpentine beams and for connecting said plurality of serpentine beams, wherein
   said connecting section is provided with a contactor on one side thereof, said side being opposite to the side to which said beams are connected, and the contactor making contact with an object to be tested,
   said plurality of serpentine beams are a pair of beams folded at a predetermined frequency, and
   said folding frequencies of said pair of serpentine beams are mutually out of phase.

5. The probe needle according to claim 4, wherein the mutual folding phase shift between said pair of serpentine beams is 180 degrees.

6. The probe needle according to claim 4, wherein one end of said probe needle is connected to an interposer.

* * * * *